United States Patent [19]

Furukawa et al.

[11] Patent Number: 5,643,822

[45] Date of Patent: Jul. 1, 1997

[54] METHOD FOR FORMING TRENCH-ISOLATED FET DEVICES

[75] Inventors: Toshiharu Furukawa, Essex Junction, Vt.; Jack Allen Mandelman, Stormville, N.Y.; William R. Tonti, Essex Junction, Vt.

[73] Assignee: International Business Machines Corporation, Armonk, N.Y.

[21] Appl. No.: 370,703

[22] Filed: Jan. 10, 1995

[51] Int. Cl.⁶ .................................................. H01L 21/76
[52] U.S. Cl. ............................ 437/67; 437/34; 437/57; 437/58
[58] Field of Search ................... 437/67, 34, 56, 437/57, 58

[56] References Cited

U.S. PATENT DOCUMENTS

| | | | |
|---|---|---|---|
| 4,140,558 | 2/1979 | Murphy et al. | 437/67 |
| 4,466,178 | 8/1984 | Soclof | 437/67 |
| 4,466,180 | 8/1984 | Soclof | 437/67 |
| 4,472,240 | 9/1984 | Kameyama | 437/67 |
| 4,523,369 | 6/1985 | Nagakubo | 437/67 |
| 4,534,824 | 8/1985 | Chen | 156/628 |
| 4,857,477 | 8/1989 | Kanamori | 437/47 |
| 4,965,221 | 10/1990 | Dennison et al. | 437/70 |
| 5,506,168 | 4/1996 | Morita et al. | 437/67 |

FOREIGN PATENT DOCUMENTS 0036941  2/1984  Japan ........................ 437/67

OTHER PUBLICATIONS

"Trench-Isolation Technology Using Al Ion Implantation in a SiO2 Layer", Miura et al., *1988 Symposium On VLSI Technology*, 19-20 (May 1988).
"Sidewall Channel-Stop Doping for Deep-Trench Isolation of FET Devices", Taur, *IBM Technical Disclosure Bulletin*, 27, No. 10A, 5501-5504, (Mar. 1985).
"A Variable-Size Shallow Trench Isolation (STI) Technology With Diffused . . . ", Davari et al., *IEDM 88 Technical Digest*, Cat. No. 88 CH2528-8, 92-95 (1988).
"Trench Isolation With Boron Implanted Side-Walls for Controlling . . . ", G. Fuse et al., *Digest of Technical Papers for 1985 Symposium on VLSI Technology*, IEEE Cat. No. CH2125-3, 58-59 (May 1985).
"Characteristics of CMOS Device Isolation for the ULSI Age",Bryant et al., *IEDM* (4 pages) (Dec. 1990).
"A New Isolation Method with Boron-Implanted Sidewalls for Controlling Narrow-Width Effect", Fuse et al., *IEEE Transactions on Electron Devices*, vol. ED-34, No. 2, 356-360 (Feb. 1987).
"Process and Device Simulation of Trench Isolation Corner Parasitic Device", Furukawa et al., The Electrochemical Society, Chicago, IL, 1-2, (2 pages) (Oct. 9-14, 1988).
"The Current-Carrying Corner Inherent to Trench Isolation", Bryant, *IEEE Electron Device Letters*, vol. 14, No. 8, 412-414 (Aug. 1993).
"Behavior of an NMOS Trench-Isolated Corner Parasitic Device at Low Temperature", Foty et al., Proceedings of the 1989 Meeting of the Electrochemical Society, Hollywood, FL (Oct. 1989).

*Primary Examiner*—John Niebling
*Assistant Examiner*—Long Pham
*Attorney, Agent, or Firm*—Heslin & Rothenberg, P.C.

[57] ABSTRACT

A method for improving the subthreshold leakage characteristics of a trench-isolated FET device is described. This method involves first forming a vertical slot within a stack structure disposed on an oxide-covered silicon substrate, and then forming spacers on the sidewalls of the slot. A trench is then etched in the substrate. Removal of the spacers uncovers a horizontal ledge on the exposed surfaces of the oxide-covered substrate, adjacent the trench. The ledge is then perpendicularly implanted with a suitable dopant, thereby suppressing edge conduction in the device. Articles prepared by this method are also described.

17 Claims, 5 Drawing Sheets

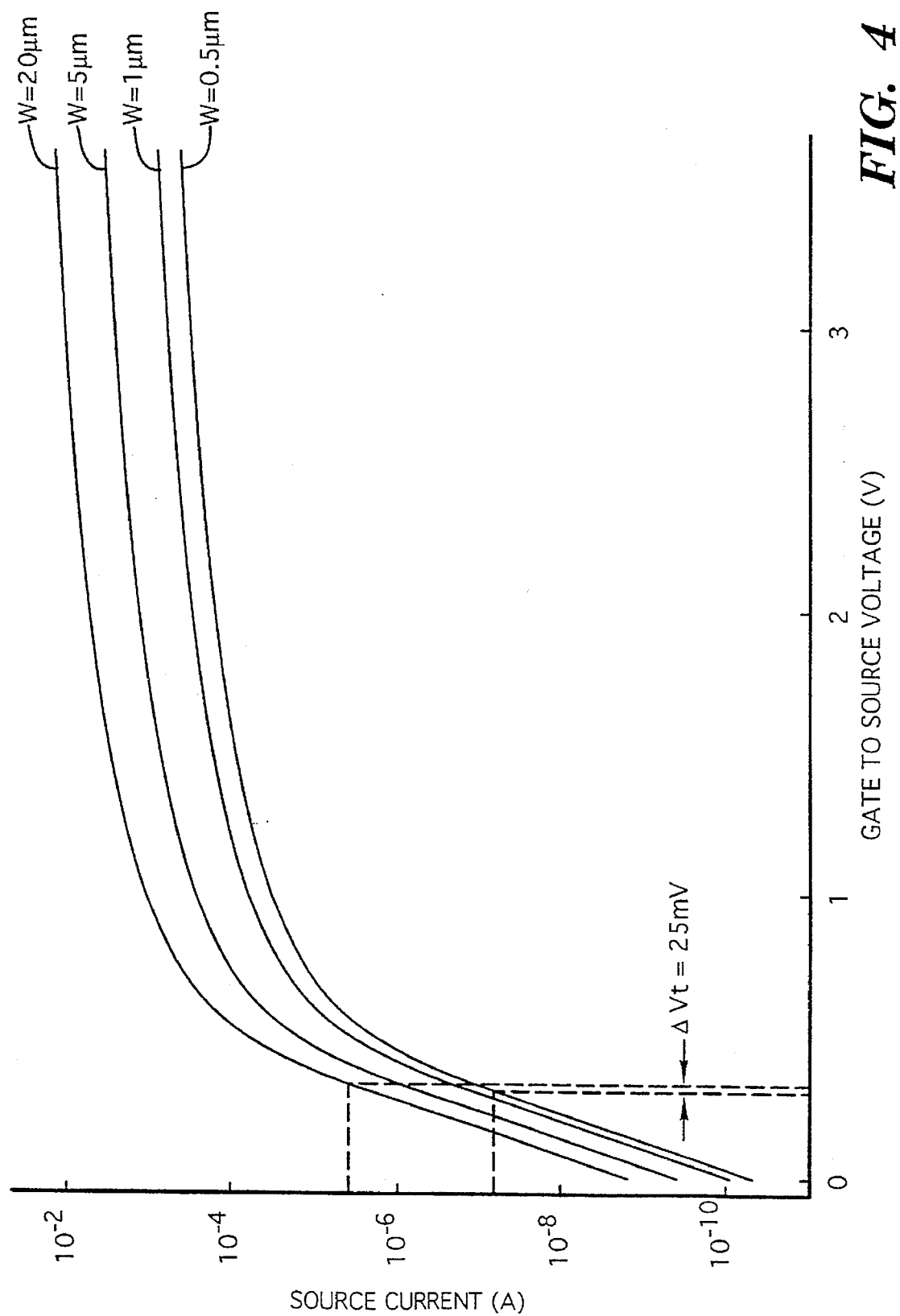

METHOD FOR FORMING TRENCH-ISOLATED FET DEVICES

TECHNICAL FIELD

The present invention relates generally to semiconductor devices, and more particularly, to methods for improving the subthreshold leakage characteristics of field effect transistor devices.

BACKGROUND ART

Field-effect transistors (FETs) are very useful devices for a variety of electronic applications, such as analog switches, amplifiers of ultra-high input impedance, and voltage-controlled resistors. They are especially useful for large-scale integration (LSI) and very large-scale integration (VLSI) digital circuits, such as those used in memory chips and microprocessors.

The FETs used in high performance complementary metal oxide semiconductor (CMOS) circuits require advanced isolation techniques for filling recessed field oxide regions. One very common isolation technique is known as LOCOS (Local Oxidation of Silicon), and is described, for example, in U.S. Pat. No. 4,965,221. While LOCOS is suitable for certain CMOS applications, it has some disadvantages. For example, the LOCOS process is often not suitable for deep submicron dimensions for density-driven memory applications, because it can result in an undesirable isolation encroachment into the active device area, commonly referred to in the industry as "bird's beak". Field doping encroachment problems can also occur.

In terms of contemporary technology, shallow trench isolation (STI) exhibits significant improvements over some aspects of the LOCOS process, especially in high density CMOS circuits. As an example, STI permits the full realization of a minimum photolithographic dimension for the isolation width of a device. Higher density circuit layouts are thus possible. Also, the use of STI can lead to greater "latch-up" immunity. STI is generally described by B. Davari et al in the 1988 IEDM 88 Technical Digest, Cat. No. 88 CH2528-8, pp. 92–95.

While the use of STI leads to many desirable circuit device properties, the technique also possesses some disadvantages. One significant drawback common in STI is the presence of "edge conduction", i.e., excessive leakage current in the upper region between the top of a filled oxide trench and an adjacent silicon mesa (FIG. 1, described below, depicts this region). FET devices which exhibit high edge conduction are characterized by significant parasitic leakage, which is very undesirable, especially in low power applications which cannot tolerate current leakage of more than about 0.1 nA/micron.

One apparent way to reduce edge conduction is to uniformly dope the entire device, i.e., both the edge and planar regions. However, this solution is not altogether satisfactory because the planar threshold, as well as the edge threshold, is increased. The amount of planar current-drive lost outweighs the gain in suppressed leakage. Furthermore, devices doped at this level are susceptible to leakage-induced threshold shifts caused by the doping-induced field gradient.

Another attempt at reducing edge conduction involves the use of an active edge mask. As an example of this technique, a layer of borosilicate glass is first deposited on the surfaces of the trenches bounding the device, and then patterned so that it remains in the areas where current leakage must be suppressed. Doping is then carried out, and the dopant diffuses around the entire trench.

While the use of an active edge mask does in fact reduce edge conduction and the accompanying parasitic leakage, additional problems also result. For example, capacitance from the source-drain diffusion regions of the device may be undesirably increased because the vertical sidewalls of the trench have been doped. Furthermore, as the device width is narrowed, the dopant on the sidewalls will raise the "substrate sensitivity", i.e., the change in threshold voltage ($V_t$) per unit change in source-to-substrate voltage. An increase in substrate sensitivity often detracts from the performance characteristics of the device. Moreover, removal of the glass layer from the bottom corners of the etch trench can be a very difficult (but necessary) task.

Another technique for reducing edge conduction involves the use of angled ion implantation into the isolation trench sidewalls, as described, for example, by G. Fuse et al in *A New Isolation Method with Boron-Implanted Sidewalls for Controlling Narrow-Width Effect*, IEEE Transactions on Electron Devices, Vol. ED-34, No. 2, February, 1987, pp. 356–360. However, use of such a technique can result in many of the drawbacks evident when using the other techniques described above, e.g., an increase in substrate sensitivity and capacitance.

It should thus be apparent that a need still exists for a method of controlling excessive edge conduction in trench-isolated FETs, especially STI FETs. The method should reduce parasitic current leakage, but not adversely affect the electrical output characteristics of the device. Furthermore, the substrate sensitivity of the device should not be significantly increased when edge conduction is suppressed. Finally, the method should not involve additional process steps that complicate device fabrication, or make it more costly.

DISCLOSURE OF INVENTION

The needs discussed above have been satisfied by the discovery of a method for improving the subthreshold leakage characteristics of a trench-isolated FET device. The method comprises the steps of forming a horizontal ledge on the surface of a substrate, adjacent to a trench in the substrate, and then perpendicularly implanting a dopant into the ledge, in an amount sufficient to suppress edge conduction of the device.

As an example of one specific embodiment, this method would comprise the following steps:

a) forming a vertical slot within a stack structure disposed on an oxide-covered silicon substrate, said slot terminating at the surface of the oxide;

b) forming spacers on the sidewalls of the slot;

c) etching a trench into the substrate, said trench being substantially self-aligned with the slot, and having a trench bottom and substantially vertical trench sidewalls, wherein the width of the trench is approximately equal to the distance between the base portions of the spacers;

d) removing the spacers to uncover a horizontal ledge on the exposed surface of the oxide-covered substrate, adjacent the trench; and e) perpendicularly implanting a dopant into the ledge.

As described below, use of this method results in an FET device in which edge conduction is substantially eliminated, resulting in greatly-improved device performance. While the applicability of this invention to shallow trenches is emphasized here, the invention is useful for all trench-isolated FETs.

A guard structure prepared by this method is also described, as well as FET devices incorporating such a guard structure.

BRIEF DESCRIPTION OF DRAWINGS

FIG. 4 represents typical output characteristics for FET devices prepared according to the teachings of this invention.

BEST MODE FOR CARRYING OUT THE INVENTION

Figure 1:
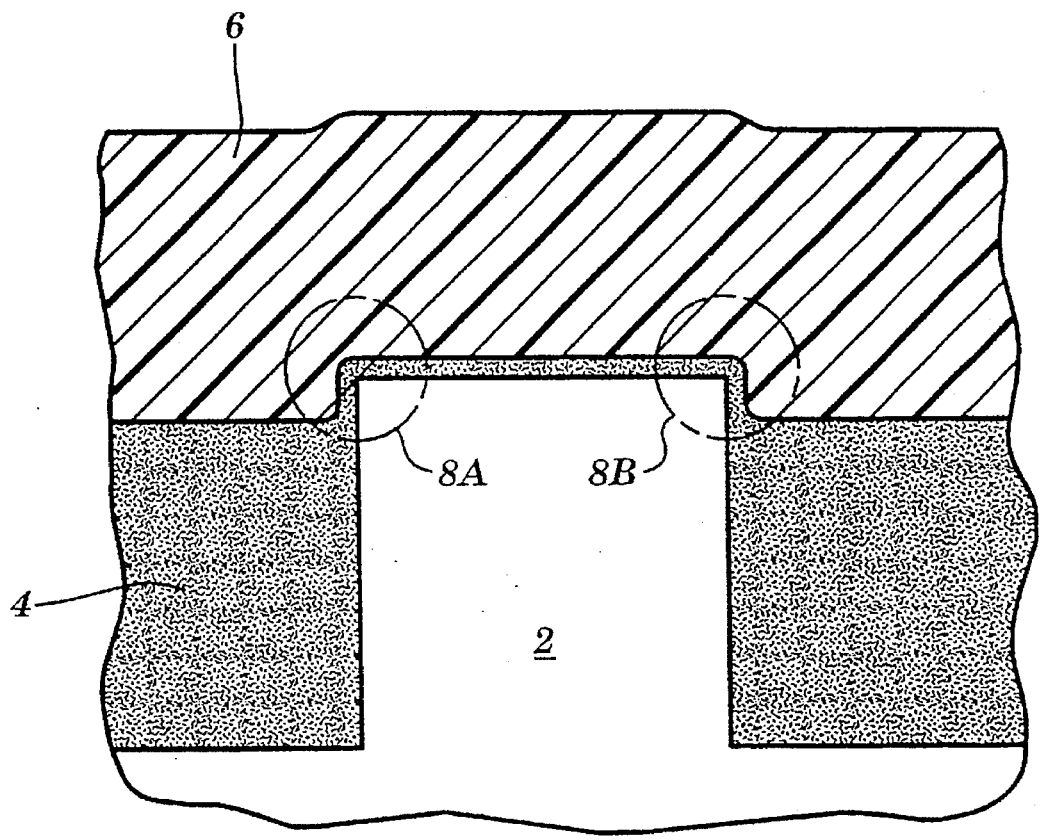
FIG. 1 is a cross-sectional view of a shallow trench-isolated FET device.

FIG. 1 is a cross-section of a typical shallow trench-isolated FET device. The primary features relevant to the present discussion are shown. Those of skill in the art understand that other features (not shown here) would also be present in such a device, e.g., various p/n junctions, depletion regions, and the like. In this simplified figure, silicon mesa 2 is surrounded by isolation trench 4, which is filled with a suitable filler material, e.g., silicon dioxide. Gate conductor 6 is usually formed from a material like polysilicon.

The circled regions 8A and 8B, in the upper corner of the boundary region between trench isolation 4 and silicon mesa 2, are the primary sites of electric field enhancement, which leads to the problem discussed previously, i.e., excessive edge conduction. When the top of the isolation region is recessed below the silicon mesa, as depicted here, the problem of edge conduction is further aggravated by the gate conductor wrapping around the corner.

Figure 2A:
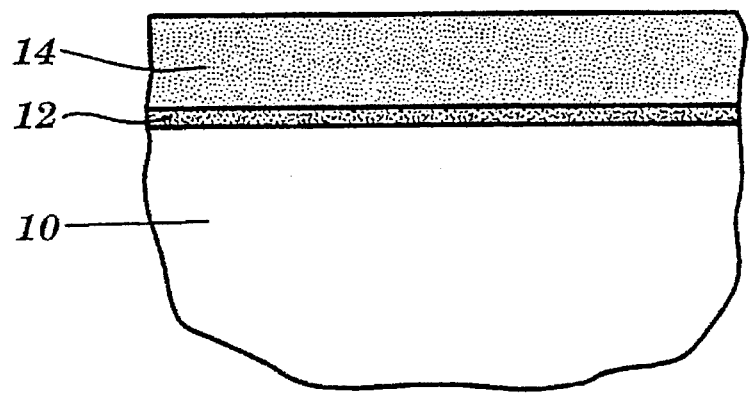
FIGS. 2A through 2G depict the steps used in the fabrication of an exemplary guard structure for an FET device prepared in accordance with one embodiment of the present invention.

FIG. 2A depicts the upper section of substrate 10, typically made of silicon, covered by oxide layer 12 (sometimes referred to as a "pad oxide layer"), which is in turn covered by stack structure 14. Pad oxide 12 is usually relatively thin, e.g., in the range of about 50 to about 500 Angstroms, and can be formed, for example, by thermal oxidation of the substrate. Pad oxide 12 may also be prepared by other methods. For example, silicon dioxide or reactive precursors like silane could be deposited by chemical vapor deposition (CVD).

Stack structure 14 may comprise one layer. The single layer, applied directly over pad oxide 12, is usually a nitride, e.g., silicon nitride. The nitride layer (sometimes referred to as a "pad nitride layer") helps to protect the pad oxide and the underlying substrate during various processing steps. It usually has a thickness in the range of about 100 Angstroms to about 6000 Angstroms, and preferably, in the range of about 1500 Angstroms to about 3000 Angstroms. Conventional means can be used to apply the nitride layer, e.g., chemical vapor deposition (CVD).

In some embodiments, stack structure 14 comprises at least two layers. For example, a polymer layer may be applied over a nitride layer. Various polymers common in semiconductor fabrication may be employed, such as those typically used as photoresist materials. If a photoresist material is utilized as an upper layer in the stack structure, it should be separated from the photoresist material which would probably be employed to subsequently form the slot in the stack (described below). Separation of the two photoresist materials could be accomplished by the use of an intervening film, e.g., one formed of low temperature-CVD oxide or nitride. Such a film would have a thickness in the range of about 100 Angstroms to about 500 Angstroms.

If rigorous processing steps involving significant heat generation are to be used in subsequent processing, the polymer layer deposited over the first layer in the stack (e.g., the nitride layer) should be formed of a material with heat-resistant properties, such as a polyimide material. The thickness of the polymer layer (be it a regular-temperature or high temperature material) is dependent, in part, on processing conditions and the nature of the other materials employed. Typically, the thickness (after curing) will range from about 1000 Angstroms to about 6000 Angstroms. The polymer layer can be applied by conventional methods, e.g., by spinning. When a polymer layer is applied on top of the nitride layer, the thickness of the nitride layer will usually be in the range of about 500 Angstroms to about 1000 Angstroms.

Sometimes, a low temperature-CVD oxide or nitride film is applied over the polymer layer. In this instance, such a film improves the quality of image transfer through the stack structure. It usually has a thickness in the range of about 100 Angstroms to about 500 Angstroms.

Another optional layer which can be utilized as part of stack 14 is a plasma-deposited layer, such as a plasma oxide or plasma nitride layer. This layer can also help to improve the quality of image transfer through the stack structure. The plasma layer usually has a thickness in the range of about 100 Angstroms to about 500 Angstroms. Methods for preparing such a layer are known in the art. Plasma-enhanced CVD (PECVD) is one common technique.

Alternatives to the exemplary stack structure described above are of course possible. For example, instead of the plasma-deposited layer and the polymer layer, a single oxide layer could be applied over the nitride layer. The oxide material for this layer is preferably of low density, for faster etching. Plasma CVD could be used to apply such a layer. The oxide layer will usually have a thickness in the range of about 1000 Angstroms to about 6000 Angstroms.

It should be understood that various other layers or combinations of layers may constitute the stack structure— its particular characteristics usually are not critical to the present invention. Selection of the most appropriate layers can be determined by those of ordinary skill in the semiconductor processing art, based on a variety of factors, such as subsequent etching conditions; the desired type of spacer material (described below); the desired width of the spacers; processing temperature requirements; and etch selectivities.

Figure 2B:
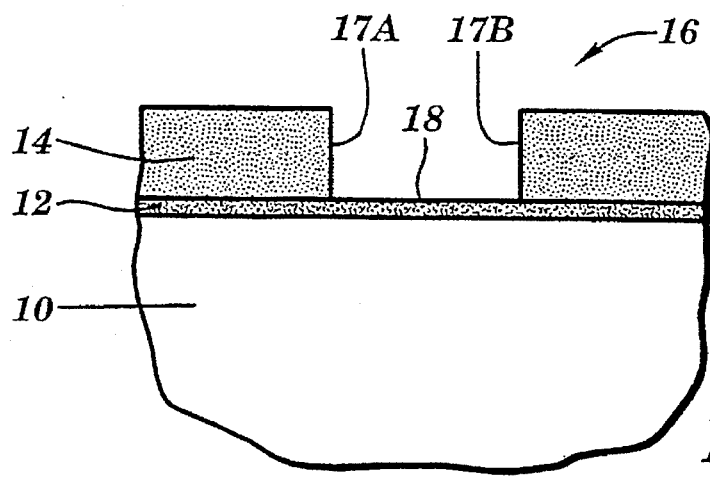

As depicted in FIG. 2B, a slot 16 is then formed in stack structure 14. The sidewalls of the slot are designated as 17A and 17B, and the bottom of the slot is referenced by numeral 18. Such a slot can be formed by conventional techniques. For example, a suitable photoresist layer (not shown) could be applied over the top surface of the stack, and then patterned to define the dimensions of the slot. The defined area could then be directionally etched, using, for example, reactive ion etching (RIE) techniques. The dimensions of slot 16 will of course depend on the desired dimension of the trench which will eventually be formed immediately below it. Usually, the slot will have a width in the range of about 0.1 micron to about 2.0 microns. The slot could, however, be quite large, e.g., up to or greater than 1.0 centimeter, depending on the particular FET being fabricated.

Furthermore, those familiar with microelectronics understand that inevitable advances in technology could eventually result in the use of slots much smaller than 0.1 micron. It is expected that the present invention would be quite operable under those circumstances also.

Figure 2C:
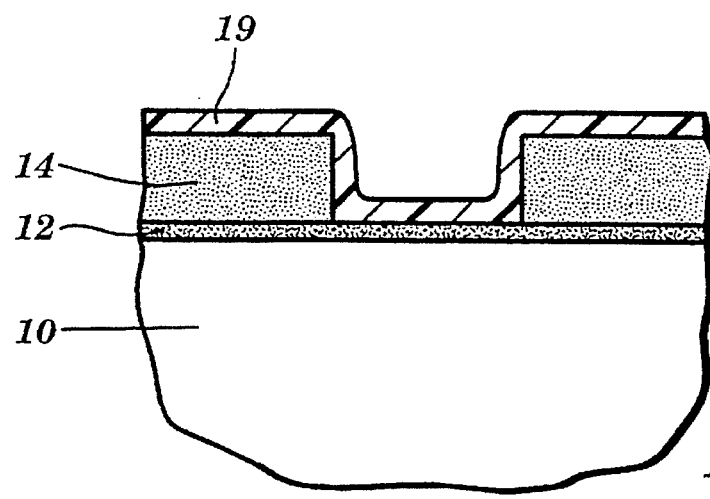
Figure 2D:
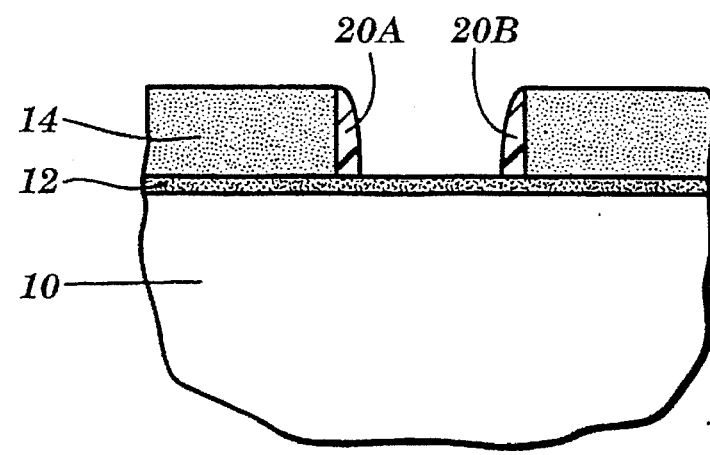

Spacers are then formed on the sidewalls of the etched layers (i.e., the sidewalls 17A, 17B of slot 16), as shown in FIGS. 2C and 2D. The spacers can be formed, for example, by applying a uniform layer of a spacer material (layer 19 in FIG. 2C) over substantially all of the exposed surfaces of oxide layer 12 and stack structure 14, and then etching all horizontally-disposed regions of the spacer layer.

Choice of an appropriate spacer material will depend in part on the materials forming the stack layer, and their respective etch selectivities. Examples of suitable spacer materials are plasma-deposited CVD oxide (e.g., silicon dioxide); and polymers such as parylene or photoresist materials.

Etching of the horizontal regions of the spacer layer can be carried out by applying a directed reactive ion beam downwardly onto the substrate. After the etching step, spacers 20A and 20B remain, as depicted in FIG. 2D. The spacers remain in place while the trench is formed, as described below.

Figure 2E:
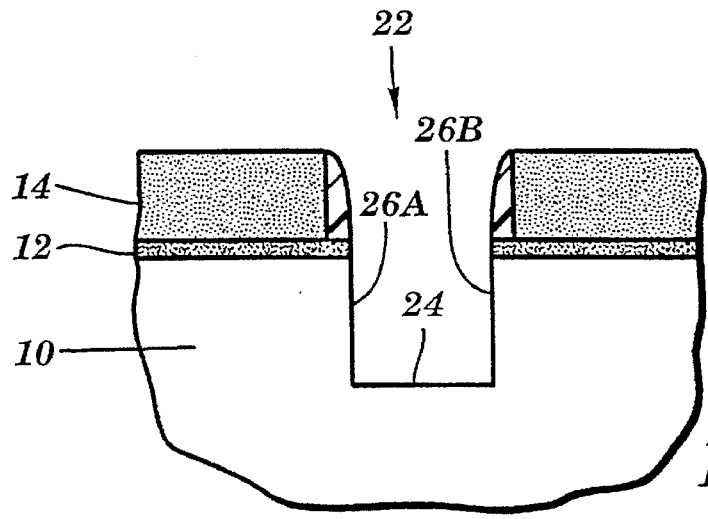

A directed etching process like RIE is used to prepare a trench 22, as shown in FIG. 2E. The trench extends completely through oxide layer 12, and into silicon substrate 10. In an FET device, this depth is usually in the range of about 0.1 micron to about 10 microns. In shallow trench technology, the depth is usually less than about 0.5 micron.

The sidewalls 26A, 26B of the trench should be substantially perpendicular to the horizontal surface of the substrate, i.e., at an angle no less than about 70 degrees and, preferably, no less than about 85 degrees. As is apparent from FIGS. 2E and 2F, the width of the trench will be approximately equal to the distance between the base portions of spacers 20A and 20B. For a typical FET, this width is usually in the range of about 0.1 micron to about 2.0 microns. However, as described above in reference to the slot, those of skill in the art understand that the present invention is applicable to trench widths beyond such a range, i.e., less than 0.1 micron, or greater than about 2.0 microns.

Figure 2F:
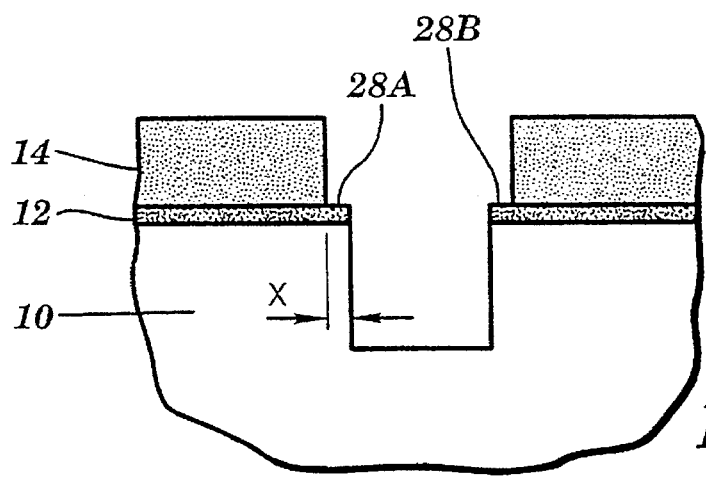

As depicted in FIG. 2F, the spacers are removed after the formation of trench 22. Removal of the spacers can be carried out, for example, by another etching step—usually some form of isotropic etching, such as plasma etching (isotropic mode), or wet-chemical etching. Those of ordinary skill in the art understand that the particular etching technique employed should be selective to removal of the spacers, while not affecting the substrate or any other layer in the device.

Removal of the spacers uncovers a horizontal ledge (28A and 28B in FIG. 2F), which is a key element of the present invention. In preferred embodiments, the top surface of the ledge will be the exposed pad oxide layer 12. If the pad oxide layer had been removed with the removal of the spacer, it can be thermally re-grown to a thickness approximately equal to the thickness of the prior oxide layer.

In an alternative embodiment, the pad oxide layer does not have to be replaced (or it can be removed purposefully, if it remains after spacer-removal). In other words, the top surface of the ledge would be the substrate surface, and the dopant can be implanted directly therethrough. Care should be taken in this type of implantation, so that gate oxide quality is not adversely affected.

The ledge, shown in FIG. 2F on each side of the trench as 28A or 28B, is formed by the upper surface of the substrate which is not covered by the stack structure. The ledge extends from the slot sidewalls to the lip of the trench. Thus, the length of the ledge is defined herein as the distance from the lower corner of a slot sidewall (i.e., the corner farthest away from trench 22), to the lip of the trench. This length, viewed in cross-section in FIG. 2F, is designated as the dimension "X". The length is usually in the range of about 100 Angstroms to about 2,000 Angstroms. Lengths greater than about 2,000 Angstroms detract from the effective width of the device, while lengths less than about 100 Angstroms may not allow for sufficient dopant implantation to reduce edge conduction. A preferred length is in the range of about 100 Angstroms to about 1,500 Angstroms, while an especially preferred ledge length for some embodiments of this invention lies in the range of about 100 Angstroms to about 500 Angstroms.

Figure 2G:
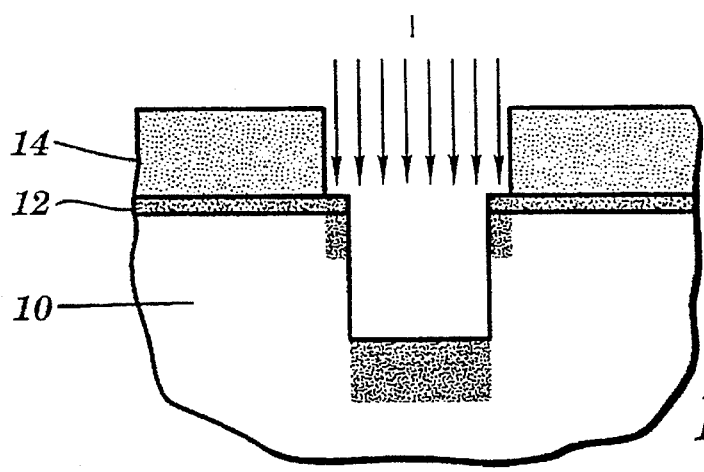

As mentioned above, the ledge is then perpendicularly implanted with a dopant, as depicted in FIG. 2G. The choice of dopant will of course depend on the particular FET device being manufactured. For example, boron is usually employed as the dopant when the FET device is of the n-channel type. Arsenic or phosphorous is usually the dopant when the FET device is of the p-channel type. The symbol "I" is used in FIG. 2G to depict the implantation of the dopant ions.

Techniques for implanting the dopant are well-known in the art and described, for example, in the following references: *Microelectronics*, by J. Millman, McGraw-Hill, 1979; *Fundamentals of Semiconductor Devices*, by E. S. Yang, McGraw-Hill, 1978; and *VLSI Technology*, S. M. Sze (Ed.), McGraw-Hill, 1988. An ion implanter is typically employed for the actual implantation. An inert carrier gas such as nitrogen is usually used to bring in the impurity source, e.g., diborane, phosphine, or arsine.

As shown in FIG. 2G, the direction of implantation is substantially perpendicular to the upper surface of the silicon substrate. Those of ordinary skill in the art understand that very precise control of the direction of implantation can be achieved with equipment currently available. The direction of implantation should thus be substantially vertical, relative to the surface of the substrate.

The concentration of dopant atoms implanted into the ledge is usually in the range of about $5 \times 10^{16}$ atoms per cc to about $5 \times 10^{18}$ atoms per cc. Amounts of dopant greater than the upper valued mentioned above can lead to device breakdown problems, especially if there are highly doped source/diffusion regions nearby. Amounts of dopant less than the lower value specified above may not be sufficient to lower the edge conduction of the device.

Another means of expressing the appropriate amount of dopant implantation into the ledge involves reference to the level of channel-doping in the device, i.e., at the mid-width of the device (as opposed to the corner or "edge" of the device). For the present invention, the concentration of dopant atoms implanted into the ledge should be about 2 to about 4 times that of the peak channel doping concentration. Thus, if the peak channel doping concentration were $2 \times 10^{17}$ atoms per cc, the dopant atom concentration in the ledge should be about $4 \times 10^{17}$ atoms per cc to about $8 \times 10^{17}$ atoms per cc. A more specific dopant concentration can be determined by observing the simulated current output characteristics for the device, as described below.

In FIG. 2G, the general area of dopant ion implantation is depicted by stippling. It is clear from the figure that implantation of the dopant into the ledge may also result in implantation of some of the dopant into trench bottom 24.

Implantation into the trench bottom is desirable, since it generally improves the isolation characteristics of the device, especially in the case of STI.

The depth of ion implantation depends in part on the energy setting for the ion implanter. As an example, the energy level when implanting single charge boron ions (B+) for suppressing edge conduction is usually in the range of about 10 KeV to about 50 KeV. Appropriate energy levels for other dopants can be determined by those skilled in the art without undue effort. In regard to the ledge, the depth should be just enough to substantially eliminate edge conduction. Ion penetration greater than that depth, i.e., into the sidewalls of the trench, may not only fail to sufficiently suppress edge conduction, but could also result in increased substrate sensitivity and increased junction capacitance. A typical depth-range for dopant penetration would be in the range of about 50 Angstroms to about 1,500 Angstroms into the substrate. Preferably, the range is about 100 Angstroms to about 500 Angstroms. The same ranges of dopant penetration into trench bottom 24 would occur.

As mentioned above, it is important that trench sidewalls 26A, 26B contain as small a concentration of dopant atoms as possible. Use of this invention (i.e., including the perpendicular implant into the substrate ledge) results in the concentration of dopant atoms implanted into the sidewalls of the trench being less than about 30% of the peak concentration of dopant atoms implanted into the ledge. In preferred embodiments, the concentration of dopant atoms implanted into the sidewalls is less than about 10% of the concentration of dopant atoms implanted into the ledge.

After the dopant has been implanted according to this invention, standard CMOS trench isolation processes (not shown here) can be used to complete the fabrication of the device. Typically, the trench is next filled with an insulator such as CVD oxide (which can be formed from tetraethoxy silane (TEOS)), and is then planarized. Next, the stack structure and pad oxide (if present) are removed, and a gate oxide region can be grown (or deposited), and defined. The gate conductors are then defined, and the source/drain regions are implanted. The back-end-of-the-line wiring can then be put into place. Other steps well-known in the art may also be carried out if appropriate, e.g., deposition of insulation layers, formation of via holes, and the like.

Trench isolation techniques are generally described, for example, in the Davari et al. article mentioned above, as well as in the following references: T. Miura et al, 1988 Symposium on VLSI Technology, IEEE Ct. No. 88 CH-2597-3, pp. 19–20; IBM Technical Disclosure Bulletin, Vol. 29, No. 6, November 1986, pp. 2760–2761. Furthermore, manufacturing techniques for FETs are generally described in many sources, such as the Millman and Sze texts described above. CMOS devices are also described throughout the art, e.g., the above-mentioned Chen patent.

It should be apparent from the description provided above that another aspect of the present invention is directed to a guard structure useful in the preparation of an improved trench isolated FET device, comprising:

a) an oxide-covered silicon substrate; covered by a stack structure which includes a slot extending to a horizontal upper surface of the substrate;

b) at least one isolated trench extending into the substrate; and substantially self-aligned with the slot, said trench having a trench bottom and substantially vertical trench sidewalls;

c) a horizontal ledge formed by the upper surface of the oxide-covered substrate which is not covered by the stack structure, said ledge extending from the vertical edge of the stack structure farthest from the trench, to the upper lip of the trench; and d) a dopant implanted into the ledge at a concentration of about $5 \times 10^{16}$ to about $5 \times 10^{18}$ dopant atoms per cc;

In preferred embodiments, the concentration of dopant atoms implanted into the ledge is about 2 to about 4 times that of the peak channel doping concentration; and the concentration of dopant atoms implanted into the sidewalls of the trench is less than about 30% of the ledge concentration. Furthermore, the stack structure could be prepared in the manner described above.

The guard structure is very useful in preparing improved FETs, as described above. Such devices can easily be provided with sub-minimum isolation features, thereby allowing for a greater source-drain interconnect area. Thus, trench isolated FETs incorporating such a structure constitute another aspect of this invention.

Figure 3:
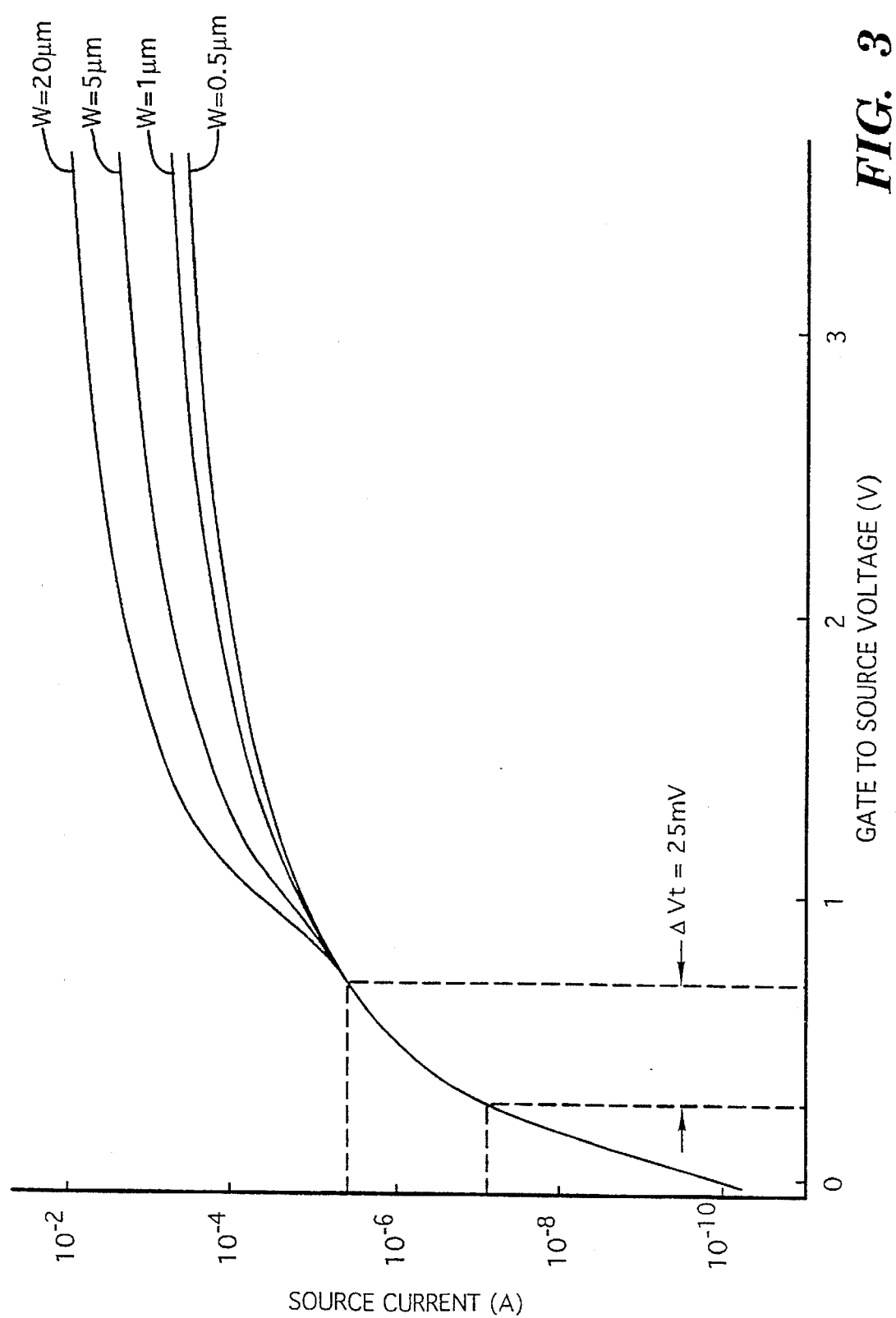
FIG. 3 represents typical output characteristics for FET devices which were not prepared in accordance with the present invention.

FIG. 3 represents typical output characteristics for FET devices which were not prepared in accordance with the present invention. FIG. 4 represents typical output characteristics for similar types of devices, prepared according to the teachings of this invention. The current/gate-to-source (G/S) voltage characteristics for each device are simulated, and were obtained by the use of a 3-D FIELDAY model of a device having a 1000 Angstrom gate "wrap-around". Such a simulation technique is described, for example, by E. Buturla et al in "A New Three-Dimensional Device Simulation Formulation", NASCODE VI: Proc. Sixth Inter. Conf. Numerical Analysis of Semiconductor Devices and Integrated Circuits, J. J. H. Miller, Ed., Dublin: Boole Pres Ltd., 1989, p. 291 et seq.

For each simulation, the multiple curves represent various device widths, and the following parameters were maintained:

$L_{\text{eff}}$ (effective channel length of device)=0.25 micron.

$V_{DS}$ (drain-to-source voltage)=3.6 volts.

$V_{SX}$ (source-to-substrate voltage)=0.0 volts.

T (temperature of silicon substrate)=85° C.

With reference to FIG. 3, a "kink" in the curve is present in the range of about 0.6 V to about 1 V, gate-to-source voltage, and is indicative of a variation in threshold voltage ($V_t$) of about 400 mV, over the width of the device. This variation, expressed sometimes as "Delta $V_t$", is an indicator of the severity of edge conduction. (Ideally, Delta $V_t$ should be as close to zero as possible.) As described previously, edge conduction is a significant problem for these low-power, low-leakage devices, which function well only when the source current can be very rapidly increased with increases in the G/S voltage. Attempts to remove the kink, i.e., to reduce edge conduction by implanting more dopant into the entire device, may succeed to some degree, but also make the device much slower.

As mentioned above, FIG. 4 represents the output characteristics for a device prepared by the method of the present invention. Removal of the kink is evident, since edge conduction has been almost completely suppressed. Delta $V_t$ has been reduced to about 25 mV, without increasing substrate sensitivity or junction capacitance.

The off-current of devices prepared by the method of the present invention is significantly reduced because of suppressed edge conduction (typically by 2 orders of magnitude). This allows the channel doping to be reduced, while still meeting the off-current objective. For the devices prepared by the method of the present invention, having the output characteristics shown in FIG. 4, the channel doping has been reduced such that the off-current at a device width, W, of 1 um is equal to the off-current of the devices exhibiting strong edge conduction (FIG. 3). This allows a greater on-current to be realized. As is apparent from FIG. 4, source current is very nearly proportional to device width, W, since the contribution of edge conduction to the total source current is negligible.

Other modifications and variations of this invention are possible in view of the description thus provided. It should be understood, therefore, that changes may be made in the particular embodiments shown which are within the scope of the invention defined in the appended claims.

All of the patents, articles, and texts mentioned above are incorporated herein by reference.

We claim:

1. A method for improving the subthreshold leakage characteristics of a trench-isolated FET device, comprising the steps of:

a) forming a vertical slot within a stack structure disposed on an oxide-covered silicon substrate, said slot terminating at the surface of the oxide;

b) forming spacers on the sidewalls of the slot, each of said spacers having a base portion;

c) etching a trench in the substrate, said trench being substantially self-aligned with the slot, and having a trench bottom and substantially vertical trench sidewalls, wherein the width of the trench is approximately equal to the distance between the base portions of the spacers;

d) removing the spacers to uncover a horizontal ledge on an exposed upper surface of the oxide-covered substrate, the exposed upper surface being free of the stack structure disposed thereon, and the ledge being adjacent the trench; and e) perpendicularly implanting a dopant into the ledge in an amount sufficient to suppress edge conduction of the device, wherein the concentration of dopant atoms implanted into the sidewalls of the trench is less than about 30% of the concentration of dopant atoms implanted into the ledge.

2. The method of claim 1, wherein step (b) is carried out by applying a layer of a spacer material over substantially all of the exposed surfaces of the oxide-covered substrate and the stack structure; and then etching all horizontally-disposed regions of the spacer layer.

3. The method of claim 2, wherein the step of etching all horizontally-disposed surfaces is accomplished by applying a directed reactive ion beam downwardly onto the substrate.

4. The method of claim 2, wherein the spacer material is either plasma CVD oxide or a polymeric material.

5. The method of claim 1, wherein step (c) is carried out by reactive ion etching.

6. The method of claim 1, wherein removal of the spacers in step (d) is carried out by isotropic etching.

7. The method of claim 1, wherein the length of the ledge is in the range of about 100 Angstroms to about 2,000 Angstroms.

8. The method of claim 7, wherein the length of the ledge is in the range of about 100 Angstroms to about 1,500 Angstroms.

9. The method of claim 1, wherein the stack structure comprises a nitride layer.

10. The method of claim 1, wherein the stack structure comprises successively-deposited layers of (i) a nitride layer; (ii) a polymer layer; and (iii) a plasma-deposited oxide or nitride layer.

11. The method of claim 1, wherein the FET device is of the n-channel type, and the dopant implanted in step (e) is boron.

12. The method of claim 1, wherein the FET device is of the p-channel type, and the dopant implanted in step (e) is arsenic or phosphorous.

13. The method of claim 1, wherein the concentration of dopant atoms implanted into the ledge is in the range of about $5 \times 10^{16}$ atoms per cc to about $5 \times 10^{18}$ atoms per cc.

14. The method of claim 1, wherein the concentration of dopant atoms implanted into the ledge is about 2 to about 4 times that of the peak channel doping concentration.

15. The method of claim 1, wherein the concentration of dopant atoms implanted into the sidewalls of the trench is less than about 10% of the concentration of dopant atoms implanted into the ledge.

16. The method of claim 1, wherein the trench is a shallow trench.

17. A method for improving the subthreshold leakage characteristics of a trench-isolated FET device, comprising the steps of forming a horizontal ledge on the surface of a substrate, said ledge being adjacent to a trench in the substrate, said trench having substantially vertical sidewalls therein, and then perpendicularly implanting a dopant into the ledge, in an amount sufficient to suppress edge conduction of the device, wherein the concentration of dopant atoms implanted into the sidewalls of the trench is less than about 30% of the concentration of dopant atoms implanted into the ledge, and wherein the dopant has a conductivity type the same as the conductivity type of the substrate.

* * * * *